United States Patent
Akagawa et al.

(10) Patent No.: US 7,303,243 B2
(45) Date of Patent: Dec. 4, 2007

(54) PATTERN DRAWING APPARATUS AND PATTERN DRAWING METHOD FOR FORMING PATTERNS, THAT HAVE MIRROR IMAGE RELATIONSHIP TO EACH OTHER WITH RESPECT TO A SUBSTRATE, ON BOTH SIDES OF THE SUBSTRATE, AND TEST APPARATUS FOR USE IN THE PATTERN DRAWING APPARATUS

(75) Inventors: Masatoshi Akagawa, Nagano (JP); Kazunari Sekigawa, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 350 days.

(21) Appl. No.: 10/790,872

(22) Filed: Mar. 3, 2004

(65) Prior Publication Data
US 2004/0179050 A1  Sep. 16, 2004

(30) Foreign Application Priority Data
Mar. 12, 2003  (JP)  ............................. 2003-066797

(51) Int. Cl.
*B41J 3/00* (2006.01)
(52) U.S. Cl. ................................. 347/2; 347/9; 347/14
(58) Field of Classification Search .................... 347/2, 347/9, 14, 19, 5; 399/306
See application file for complete search history.

(56) References Cited

U.S. PATENT DOCUMENTS

| | | | | |
|---|---|---|---|---|
| 3,580,670 A | * | 5/1971 | Bhagat | 399/306 |
| 5,995,717 A | * | 11/1999 | Tanaka | 358/1.9 |
| 6,032,015 A | * | 2/2000 | Umeda et al. | 399/306 |
| 2001/0048515 A1 | | 12/2001 | Mei | |

FOREIGN PATENT DOCUMENTS

| | | |
|---|---|---|
| CN | 1094827 | 11/1994 |
| JP | 2-158160 | 6/1990 |
| JP | 5-190531 | 7/1993 |
| JP | 2001-42544 | 2/2001 |

OTHER PUBLICATIONS

Chinese Patent Office Action, mailed Jun. 8, 2007 and issued in corresponding Chinese Patent Application No. 200410004694.2.

* cited by examiner

*Primary Examiner*—Lam S. Nguyen
(74) *Attorney, Agent, or Firm*—Staas & Halsey LLP

(57) ABSTRACT

A pattern drawing apparatus for forming patterns, that have a mirror image relationship to each other with respect to a substrate, on both sides of the substrate forms the patterns on both sides of the substrate by drawing the patterns directly on both sides of the substrate in accordance with prescribed data by using a direct drawing means such as a maskless exposure means or an inkjet patterning means.

18 Claims, 9 Drawing Sheets

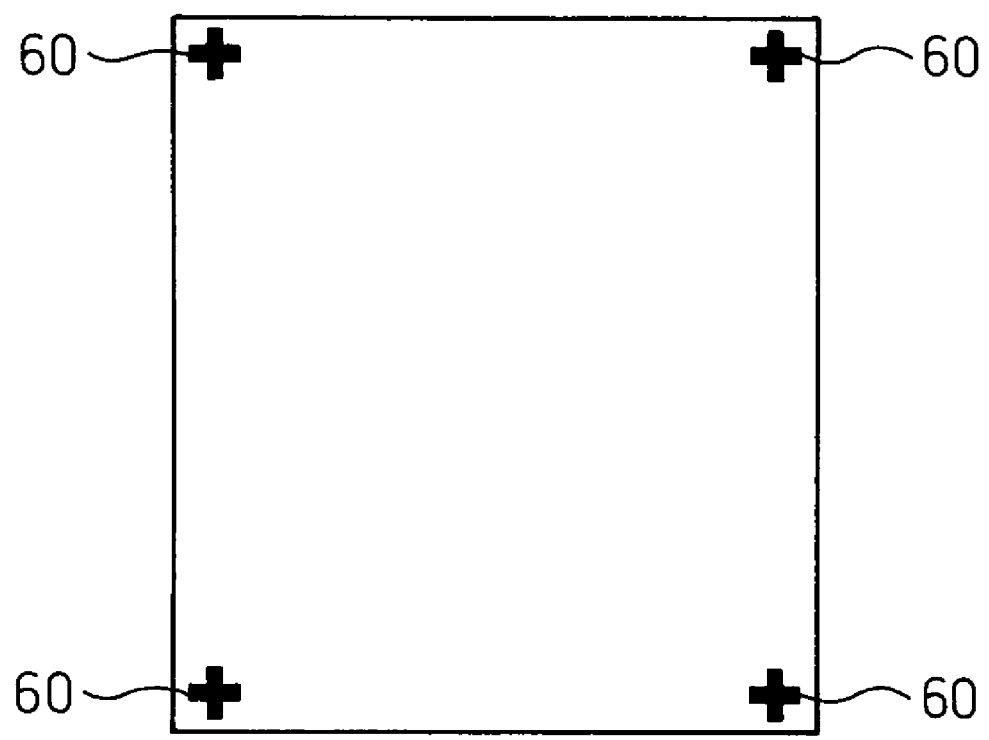

PATTERN DRAWING APPARATUS AND PATTERN DRAWING METHOD FOR FORMING PATTERNS, THAT HAVE MIRROR IMAGE RELATIONSHIP TO EACH OTHER WITH RESPECT TO A SUBSTRATE, ON BOTH SIDES OF THE SUBSTRATE, AND TEST APPARATUS FOR USE IN THE PATTERN DRAWING APPARATUS

BACKGROUND OF THE INVENTION

1. Field of the Invention

The present invention relates to a pattern drawing apparatus and pattern drawing method for forming patterns, that have a mirror image relationship to each other with respect to a substrate, on both sides of the substrate, and a test apparatus for use in the pattern drawing apparatus.

2. Description of the Related Art

When forming patterns, that have a mirror image relationship to each other with respect to a substrate, on both sides of the substrate, the patterns formed on the respective sides of the substrate must be made to exactly match in shape and position. That is, when the substrate is optically observed therethrough from one side, the patterns formed on the respective sides must appear to be superimposed.

FIG. 8 is a diagram illustrating one side of a substrate on both sides of which are formed patterns that are mirror images of each other. FIG. 9 is a diagram illustrating the other side of the substrate on both sides of which are formed the patterns that are mirror images of each other.

Representative examples of patterns that have a mirror image relationship to each other with respect to a substrate include lead patterns of a leadframe member. A leadframe is used in an IC package, such as a dual in-line package (DIP), to electrically connect the IC chip to external devices.

As described in Japanese Unexamined Patent Publication No. 5-190531, a leadframe is formed by etching or punching a nickel-plated Kovar or copper plate with a thickness of about 0.2 mm.

Further, as described in Japanese Unexamined Patent Publication Nos. 2-158160 and 2001-42544, when forming a lead pattern by etching, a resist pattern conforming with the desired lead pattern is formed on a leadframe member, and the leads are formed by applying etching.

FIG. 10 is a diagram illustrating alignment marks which are needed for accurately forming patterns that are mirror images of each other on both sides of a substrate. Generally, in a leadframe fabrication process using etching, alignment marks 60 such as shown in FIG. 10 are formed in advance at prescribed positions on both sides of the substrate as guide marks for accurately aligning the positions of the patterns between the two sides of the substrate to be exposed to radiation. In the figure, the alignment marks are greatly exaggerated relative to the size of the substrate, but actually, they are as small as pinholes.

Using the alignment marks as guide marks, a photoresist is applied over one side (hereinafter called the "side A") of the substrate and, after placing a photo mask so as to form an exposure pattern on the side A, the side A is exposed to radiation.

Likewise, using the alignment marks as guide marks, a photoresist is applied over the other side (hereinafter called the "side B") of the substrate and, after placing a photo mask so as to form an exposure pattern on the side B, the side B is exposed to radiation.

Here, the photo mask placed on the side B is in a mirror image relationship to the photo mask placed on the side A and, using the alignment marks formed on the sides A and B as guide marks, the position of the photo mask placed on the side B is adjusted so that the positions of the exposure patterns coincide with each other on both sides of the substrate. In this specification, this adjusting process is called the "photo mask alignment process."

When exposure is completed on both the side A and side B of the substrate, the substrate is developed to form resist patterns, and portions exposed from the resist patterns are etched away to obtain a leadframe having the desired pattern.

In the prior art leadframe fabrication method using etching, as two photo masks of different patterns are required, one for each side of the substrate, the cost is relatively high. In particular, as the number of trials increases, the cost increases.

Furthermore, the prior art requires the photo mask alignment as described above. As for the shapes of the photo mask patterns, this can be accomplished relatively easily as it only requires mirror image conversion of data. However, for the positional alignment of the photo mask patterns, as the two sides of the substrate have to be optically treated using the alignment marks as guide marks, the fabrication process becomes complex and time-consuming.

Additionally, as the photo mask alignment and the exposure described above must be performed on both sides of the substrate, that is, as the photo mask alignment and the exposure each have to be performed twice, it is difficult to shorten the fabrication process as long as this method is used.

Usually, each photo mask is placed in intimate contact with the substrate for use, and there is a limit to the number of times the same photo mask can be used. This means that when the photo mask comes to the end of its life, a new photo mask has to be produced; this increases the production cost and is inefficient.

In view of the above problems, it is an object of the present invention to provide a pattern drawing apparatus and pattern drawing method that can reduce the cost and shorten the fabrication process when forming patterns, that have a mirror image relationship to each other with respect to a substrate, on both sides of the substrate. It is also an object of the present invention to provide a test apparatus for use in the pattern drawing apparatus.

SUMMARY OF THE INVENTION

To achieve the above object, according to the present invention, a pattern drawing apparatus for forming patterns that have a mirror image relationship to each other with respect to a substrate on both sides of the substrate forms the patterns on both sides of the substrate by drawing the patterns directly on both sides of the substrate in accordance with prescribed data.

The direct drawing means includes drawing heads arranged facing each other, and draws the patterns directly on both sides of the substrate by placing the substrate between the drawing heads.

Further, according to the present invention, preferably a displacement from the mirror image relationship of the patterns is detected using a test substrate on both sides of which the patterns are formed as described above, and drawing data is corrected based on the detected displacement so that the mirror image relationship will be maintained between the patterns formed on both sides of the substrate when the patterns are actually drawn directly thereon in accordance with the drawing data.

According to a first aspect of the invention, there is provided a pattern drawing apparatus for forming exposure patterns that have a mirror image relationship to each other with respect to a substrate on both sides of the substrate, comprising: maskless exposure means for forming the exposure patterns on both sides of the substrate by masklessly exposing both sides of the substrate in accordance with prescribed data. The maskless exposure means includes exposure heads arranged facing each other, and both sides of the substrate are masklessly exposed by placing the substrate with each side thereof facing a corresponding one of the exposure heads.

Preferably, the pattern drawing apparatus according to the first aspect of the invention further comprises: detecting means for detecting a displacement from the mirror image relationship of the exposure patterns by using a test substrate on both sides of which the exposure patterns are formed by the maskless exposure means; and correcting means for correcting exposure data based on the displacement detected by the detecting means so that the mirror image relationship will be maintained between the exposure patterns when the exposure patterns are formed on both sides of the substrate by maskless exposure by the maskless exposure means in accordance with the exposure data.

In particular, a test apparatus for use in the pattern drawing apparatus for forming the exposure patterns that have a mirror image relationship to each other with respect to the substrate on both sides of the substrate comprises the following constituent elements.

That is, the test apparatus comprises:

maskless exposure means, having exposure heads arranged facing each other, for masklessly exposing both sides of the substrate by sandwiching the substrate to be exposed between the exposure heads;

a test substrate that blocks or transmits light, and on both sides of which test exposure patterns are formed by maskless exposure using the maskless exposure means;

developing means for developing both sides of the test substrate on which the test exposure patterns have been formed;

image capturing means for capturing images on the test substrate from one side thereof after the test substrate has been developed by the developing means;

control means for controlling the test substrate in such a manner as to block light during the exposure by the exposure means and to transmit light during the image capturing by the image capturing means; and detecting means for detecting a displacement from the mirror image relationship of the test exposure patterns on the test substrate, based on the images captured by the image capturing means.

According to a second aspect of the invention, there is provided a pattern drawing apparatus for forming wiring patterns that have a mirror image relationship to each other with respect to a substrate on both sides of the substrate, comprising: inkjet patterning means for forming the wiring patterns on both sides of the substrate by drawing the patterns by inkjetting on both sides of the substrate in accordance with prescribed data. The inkjet patterning means includes inkjet heads arranged facing each other, and the wiring patterns are drawn on both sides of the substrate by placing the substrate with each side thereof facing a corresponding one of the inkjet heads.

Preferably, the pattern drawing apparatus according to the second aspect of the invention further comprises: detecting means for detecting a displacement from the mirror image relationship of the wiring patterns by using a test substrate on both sides of which the wiring patterns are formed by the inkjet patterning means; and correcting means for correcting wiring data based on the displacement detected by the detecting means so that the mirror image relationship will be maintained between the wiring patterns when the wiring patterns are formed on both sides of the substrate by inkjetting by the inkjet patterning means in accordance with the wiring data.

In particular, a test apparatus for use in the pattern drawing apparatus for forming the wiring patterns that have a mirror image relationship to each other with respect to the substrate on both sides of the substrate comprises the following constituent elements.

That is, the test apparatus comprises:

inkjet patterning means, having inkjet heads arranged facing each other, for drawing the wiring patterns on both sides of the substrate by sandwiching the substrate between the inkjet heads;

a test substrate which comprises a light transmitting panel, and on both sides of which test wiring patterns are formed by pattern drawing using the inkjet patterning means;

image capturing means for capturing images on the test substrate from one side thereof after the test wiring patterns have been formed thereon; and detecting means for detecting a displacement from the mirror image relationship of the test wiring patterns on the test substrate, based on the images captured by the image capturing means.

According to the present invention, in the fabrication of the substrate on which are formed the patterns that are mirror images of each other, as the patterns are formed on both sides of the substrate by using maskless exposure or inkjet technology, the processing speed can be increased while reducing the cost.

Further, if the positional displacements of the patterns formed on both sides of the substrate, which can occur due to displacements of the maskless exposure heads or the inkjet heads, are measured, and if the data to be used for pattern formation is corrected accordingly, the positions of electronic component, if somewhat displaced, can be easily corrected, and the fabrication cost can be reduced and the fabrication process shortened.

Moreover, since there is no need to consider the number of times that the photo masks can be used as in the prior art, the fabrication cost can be reduced and the resources saved.

Furthermore, if the mounting positions of the exposure heads or the inkjet heads are displaced over time, for example, such displacements can be flexibly accommodated by correcting the data for pattern formation.

BRIEF DESCRIPTION OF THE DRAWINGS

The present invention will be more clearly understood from the description as set forth below with reference to the accompanying drawings, wherein:

FIG. 10 is a diagram illustrating alignment marks which are needed for accurately forming patterns that are mirror images of each other on both sides of a substrate.

DESCRIPTION OF THE PREFERRED EMBODIMENTS

The preferred embodiments of the invention will be described below by taking the lead patterns of a leadframe member as examples of the patterns that have a mirror image relationship to each other with respect to the substrate. In this specification, the upper and lower sides of the substrate are referred to as the side A and side B, respectively, to facilitate understanding.

In a first embodiment of the present invention, a pattern drawing apparatus for forming patterns that have a mirror image relationship to each other with respect to a substrate on both sides of the substrate comprises a maskless exposure means as a means for drawing the patterns directly on both sides of the substrate in accordance with prescribed data.

Figure 1:
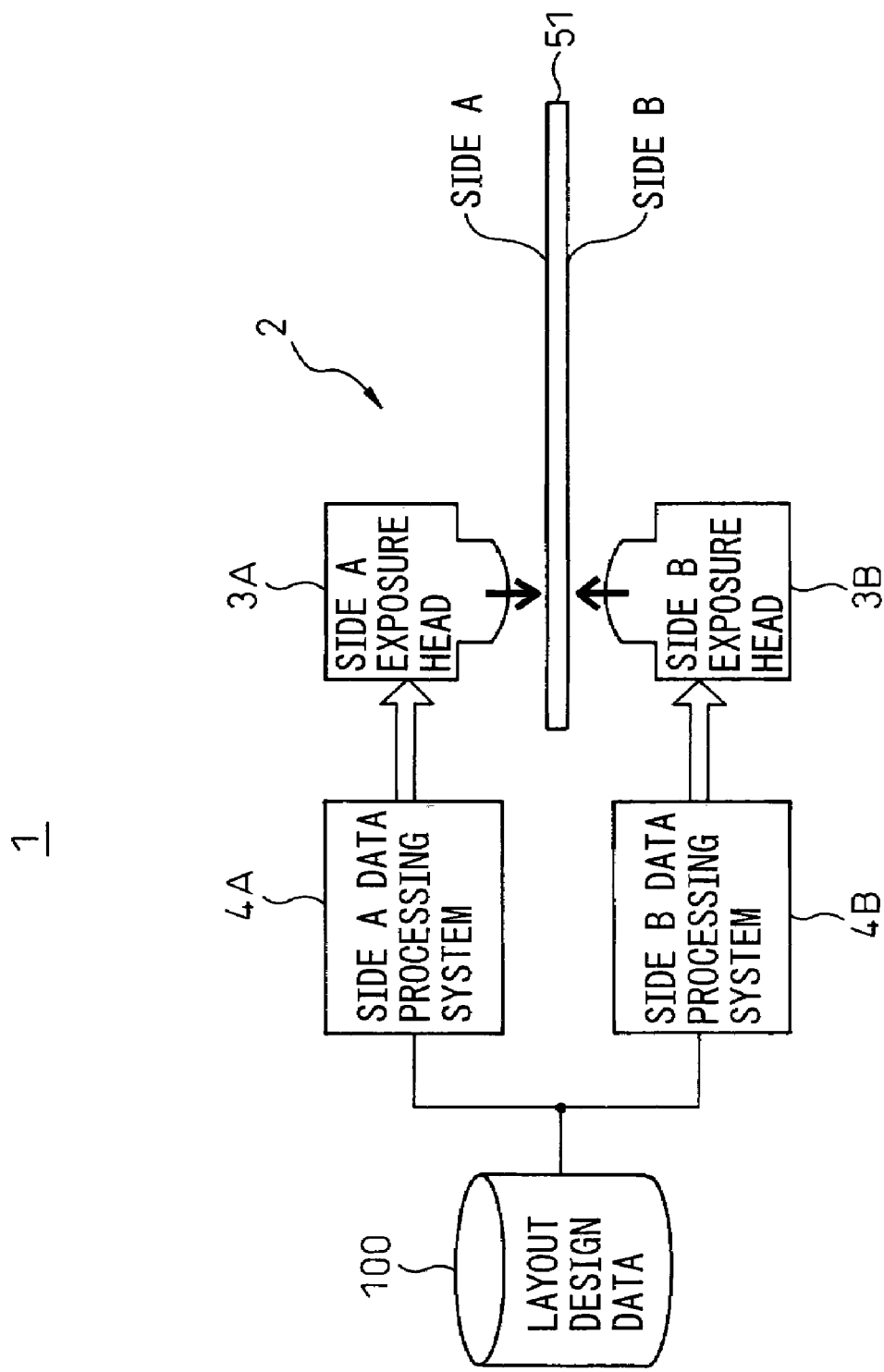
FIG. 1 is a diagram illustrating the basic principle of exposure heads in a maskless exposure means incorporated in a pattern drawing apparatus according to a first embodiment of the present invention.

FIG. 1 is a diagram illustrating the basic principle of exposure heads in the maskless exposure means incorporated in the pattern drawing apparatus according to the first embodiment of the present invention.

The pattern drawing apparatus 1 according to the first embodiment of the present invention, which is used to form the lead patterns of a leadframe member on both sides of a substrate, the lead patterns being mirror images of each other with respect to the substrate, includes the maskless exposure means 2 for forming exposure patterns on both sides of the substrate by masklessly exposing photoresist layers on both sides of the substrate in accordance with prescribed data. A direct exposure apparatus using a DMD (Digital Micromirror Device) or an electron beam exposure apparatus or the like can be used as the maskless exposure means.

In the present embodiment, the maskless exposure means 2 includes a side A exposure head 3A and a side B exposure head 3B arranged with their head portions facing each other. The substrate 51 to be exposed is placed with the side A facing the side A exposure head 3A and the side B facing the side B exposure head 3B, and both sides of the substrate 51 are masklessly exposed.

In the maskless exposure means 2 according to the present embodiment, the positions of the side A exposure head 3A and the side B exposure head 3B are preadjusted so that one faces the other as precisely as possible in order to ensure that the patterns formed on both sides of the substrate by maskless exposure will have a mirror image relationship to each other. This serves to simplify the fabrication process, as there is no need for an optical treatment to be performed using the alignment marks as guide marks as in the prior art.

Preferably, the maskless exposure according to the present embodiment is performed simultaneously on both sides of the substrate 51; this serves to greatly reduce the time required for the fabrication, compared with the prior art in which separate photo mask images are formed on the respective sides of the substrate and the respective sides are exposed separately. As a modification of the present embodiment, the maskless exposure may be performed on the respective sides of the substrate by introducing a time difference between them, rather than performing the exposure simultaneously on both sides.

Data supplied to the maskless exposure means 2 is layout design data 100 that defines the exposure pattern layout, and is stored in a database in standard Gerber format. The layout design data 100 is supplied to a side A data processing system 4A and a side B data processing system 4B.

The side A data processing system 4A and the side B data processing system 4B convert the layout design data 100 into input data for input to the side A exposure head 3A and the side B exposure head 3B, respectively. More specifically, each data processing system creates the input data for its associated exposure head by converting either side A data or side B data into a mirror image thereof relative to the other so that the exposure pattern by the side A exposure head 3A and the exposure pattern by the side B exposure head 3B, when formed by maskless exposure, will have a mirror image relationship to each other.

In accordance with the input data thus created, the side A exposure head 3A and the side B exposure head 3B perform the maskless exposure on the side A and the side B of the substrate 51.

Figure 2:
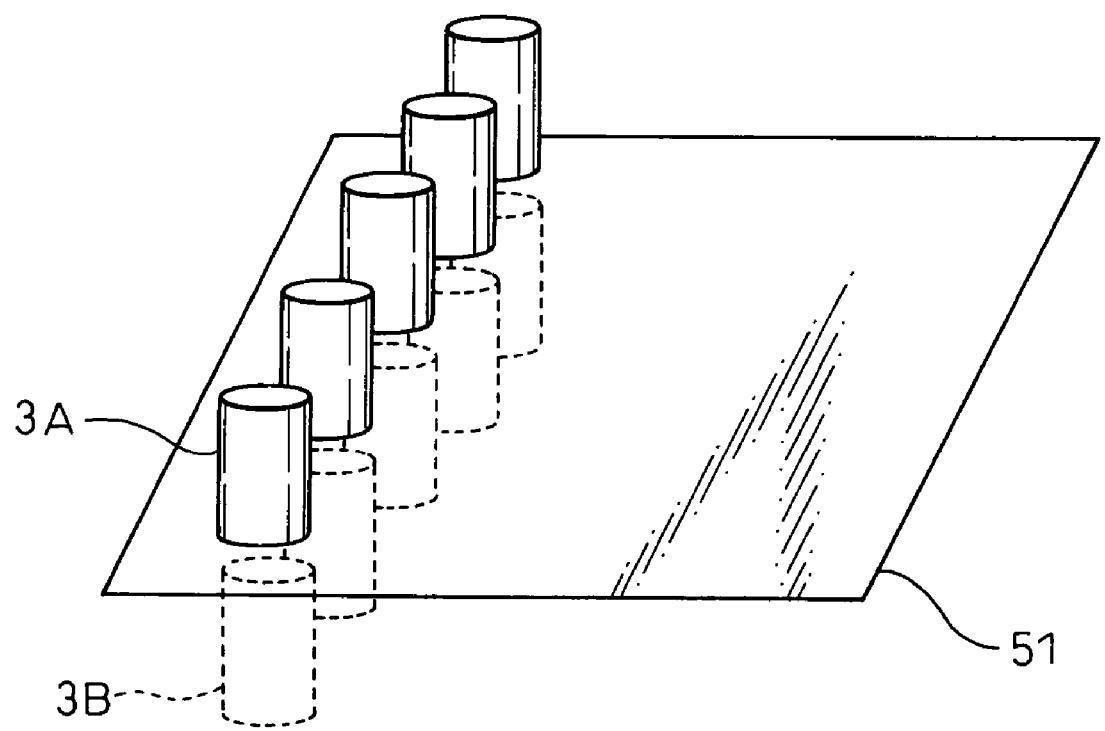
FIG. 2 is a conceptual diagram of the exposure heads used in the pattern drawing apparatus according to the first embodiment of the present invention.

FIG. 2 is a conceptual diagram of the exposure heads used in the pattern drawing apparatus according to the first embodiment of the present invention.

In FIG. 1, the maskless exposure means 2 incorporated in the pattern drawing apparatus 1 has been shown as comprising the pair of exposure heads 3A and 3B disposed opposite each other. However, to enhance the efficiency of the maskless exposure, it is preferable to provide a plurality of pairs of opposing exposure heads arranged in parallel as shown in FIG. 2 for maskless exposure of the side A and side B of the substrate 51. In this case, the regions to be exposed on the exposure target, i.e., the substrate, are assigned to the respective exposure head pairs, which perform the maskless exposure in parallel fashion. This serves to further speed up the exposure process. To achieve the parallel processing of the maskless exposure, it is preferable to store the layout design data 100 in the database shown in FIG. 1 by spatially dividing the data so that the data will be assigned selectively to the respective exposure heads.

As described above, according to the first embodiment of the present invention, in the fabrication of the substrate on which are formed the patterns that are mirror images of each other, since both sides of the substrate are masklessly exposed by the maskless exposure means that has the exposure heads arranged facing each other, the processing speed can be increased while reducing the cost.

As earlier described, in the pattern drawing apparatus according to the first embodiment of the present invention, the maskless exposure means is mounted so that the side A exposure head 3A and the side B exposure head 3B face each other, or more specifically, the head portions of the side A exposure head 3A and the side B exposure head 3B precisely face each other, in order to ensure that the patterns formed on both sides of the substrate by maskless exposure will have a mirror image relationship to each other. In actuality, however, errors occur due to the accuracy that can be mechanically achieved.

Further, as the pattern drawing apparatus according to the first embodiment of the present invention is used over time, errors occur due to changes over time, that is, mechanical displacements occur due to vibration and degradation of component parts between the positions of the side A exposure head 3A and the side B exposure head 3B that were originally mounted precisely facing each other. If maskless exposure is performed without correcting the mechanical displacement caused between the positions of the side A exposure head 3A and the side B exposure head 3B, the mirror image relationship between the patterns formed on both sides of the substrate will be disrupted. In this specification, any positional displacement mechanically caused between the side A exposure head 3A and the side B exposure head 3B and the resulting disruption in the mirror image relationship between the patterns are collectively referred to as the "alignment error".

Figure 3:
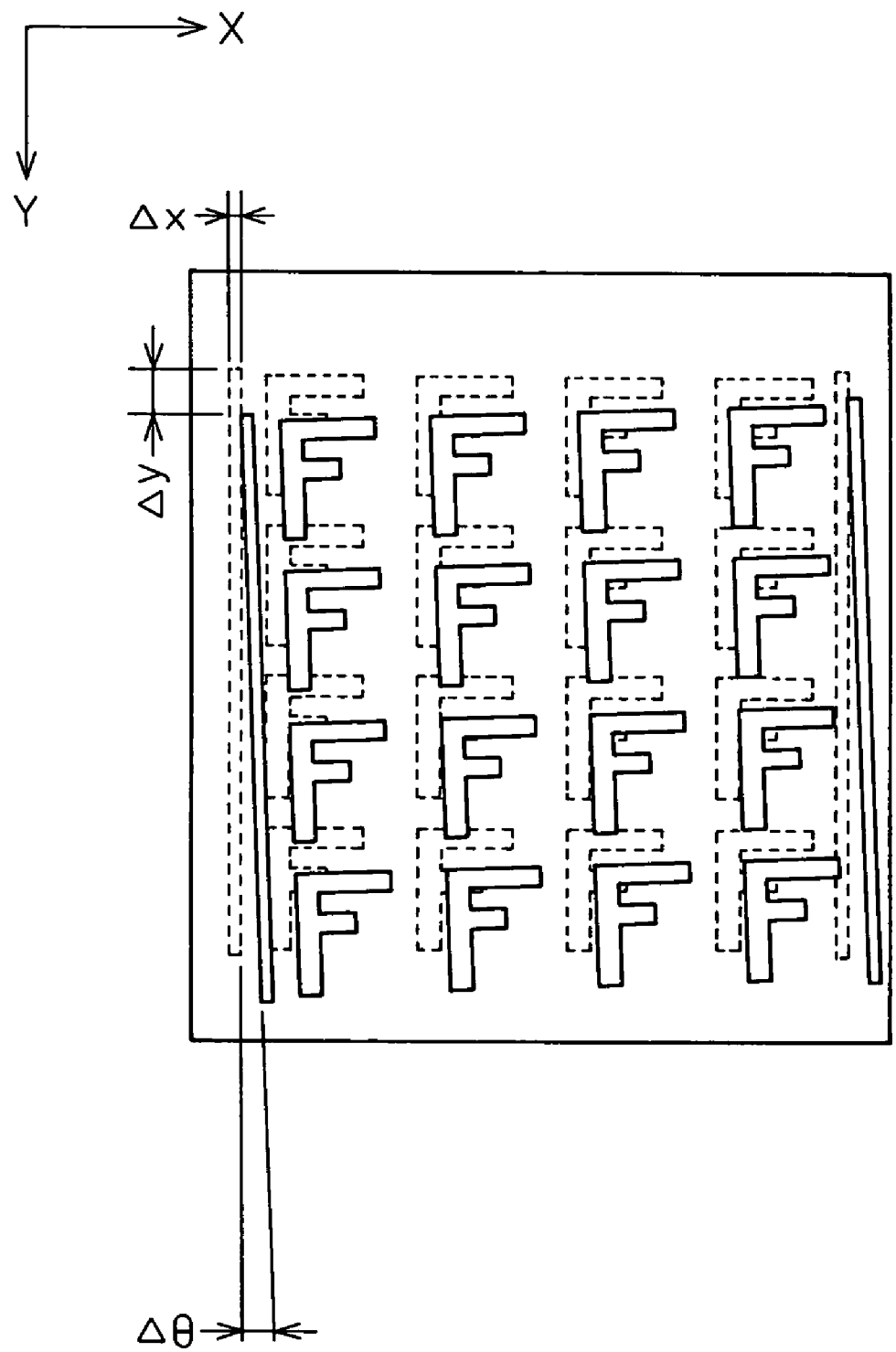
FIG. 3 is a schematic diagram showing one example of an alignment error.

FIG. 3 is a schematic diagram showing one example of such an alignment error.

Coordinate axes are set as shown, and the exposure pattern on the side A of the substrate is shown by solid lines and the exposure pattern on the side B, the side opposite to the side A, by dashed lines.

When the patterns formed on the side A and side B are observed simultaneously by seeing through the substrate from the side A thereof, ideally the patterns formed on both sides of the substrate should appear precisely superimposed. However, if there is a mechanical displacement between the positions of the side A exposure head 3A and the side B exposure head 3B, an alignment error occurs between the exposure patterns. As shown in FIG. 3, this alignment error consists of a displacement $\Delta x$ in the X-axis direction, a displacement $\Delta y$ in the Y-axis direction, and a displacement $\Delta \theta$ in the rotational direction.

Accordingly, in the present embodiment, it is preferable to further provide a correction process for eliminating the alignment error such as described above so that the patterns formed on both sides are precisely superimposed on each other in a mirror image relationship. In this specification, the process on the actual substrate production line is called the "online production mode", as contrasted to which the alignment error detection process is called the "offline adjusting mode".

In the offline adjusting mode, testing is performed by forming test exposure patterns on a test substrate and checking how much displacement (i.e., "alignment error") occurs in the mirror image relationship when the maskless exposure is performed with the current settings of the exposure heads; then, using the alignment data obtained as the result of the testing, corrections are made to the exposure data to be used in the actual production process.

On the other hand, in the online production mode, the exposure data to be used in the actual production process is corrected prior to the maskless exposure by using the above-described alignment data. Then, the substrate is masklessly exposed by using the corrected exposure data.

A detailed description will be given below of the operation of the pattern drawing apparatus in the offline adjusting mode and in the online production mode according to the first embodiment of the present invention.

First, the offline adjusting mode will be described.

Figure 4:
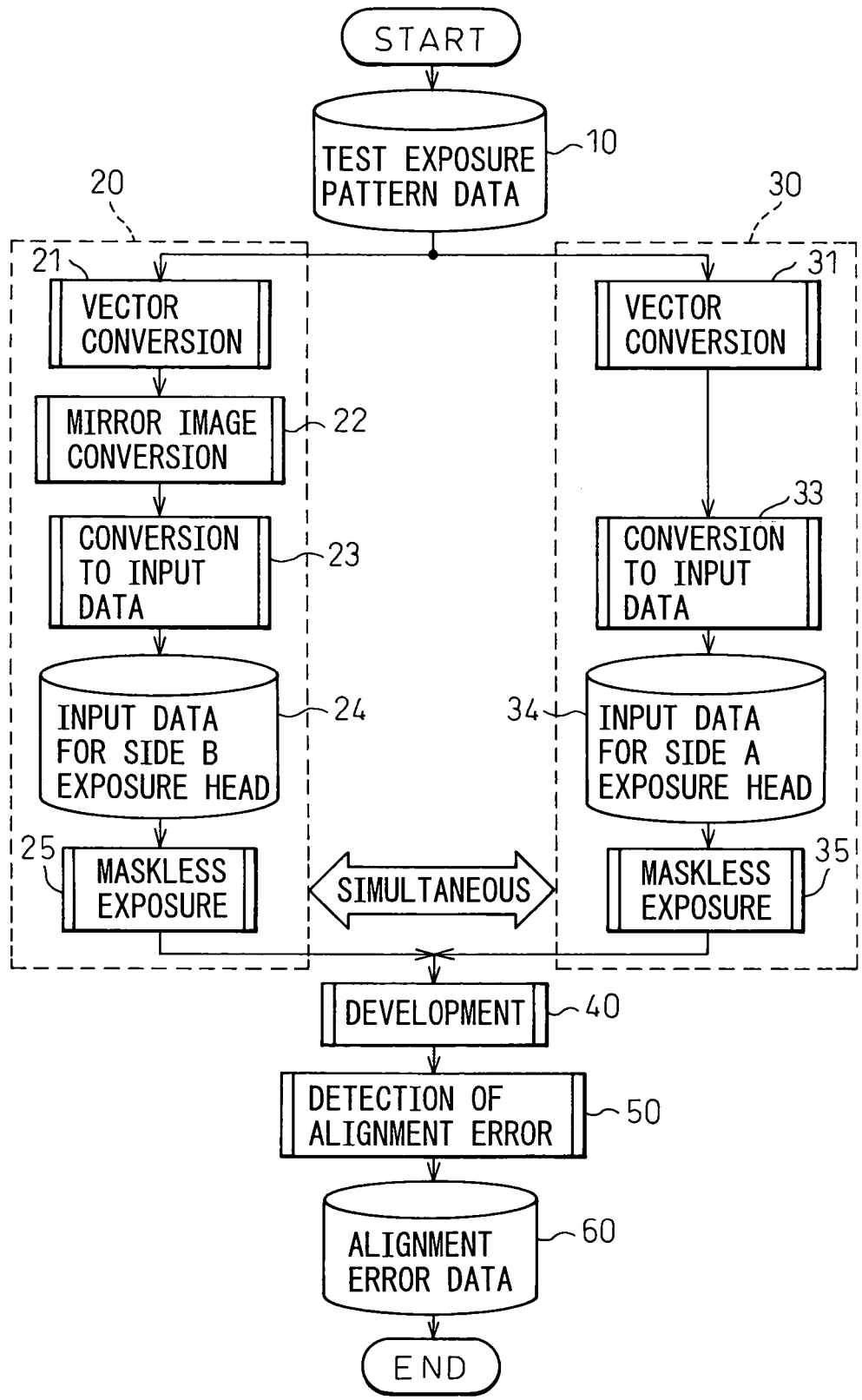
FIG. 4 is a flowchart illustrating operation in an offline adjusting mode according to the first embodiment of the present invention.

FIG. 4 is a flowchart illustrating the operation of the offline adjusting mode according to the first embodiment of the present invention.

In the offline adjusting mode, first, test exposure pattern data 10 is prepared in standard Gerber format, as shown in FIG. 4. As described above, test exposure patterns are formed on the test substrate to check how much displacement, that is, how much alignment error, occurs in the mirror image relationship when the maskless exposure is performed with the current settings of the exposure heads. Any pattern may be used as the test exposure pattern; for example, a graphical figure comprising rectangles or a graphical pattern comprising letters "F", such as shown in FIG. 3, may be used. Further, the actual exposure pattern used in the online production mode may be used as is. Design data supplied to the maskless exposure means to form such test exposure patterns is the test exposure pattern data 10.

The test exposure pattern data 10 is input to the side A data processing system 30 which performs various processing to form the exposure pattern on the side A of the substrate, and also to the side B data processing system 20 which performs various processing to form the exposure pattern on the side B of the substrate.

In step 31 in the side A data processing system 30, the test exposure pattern data 10 of Gerber format is converted to the format of vector data for the side A. Vector data is data created by extracting contour information from graphic elements, and its contents are geometrical information. By converting the data to the vector data format, the amount of data to be processed can be reduced, and therefore the processing speed of the processor can be increased.

Next, in step 33, the vector data created in step 31 is converted into input data 34 for input to the side A exposure head.

Then, in step 35, the side A of the test substrate is masklessly exposed by the side A exposure head in accordance with the input data 34.

On the other hand, in step 21 in the side B data processing system 20, the test exposure pattern data 10 of Gerber format is converted to the format of vector data for the side B.

Next, in step 22, vector data for the side B is created by mirror image conversion so that the data has a mirror image relationship to the vector data for the side A. For example, when the coordinate axes are set as shown in FIG. 3, the vector data for the side A on the coordinate plane is reversed symmetrically about the Y axis to obtain the vector data for the side B, which is a mirror image of the vector data for the side A.

Next, in step 23, the vector data created in step 22 is converted into input data 24 for input to the side B exposure head.

Then, in step 25, the side B of the test substrate is masklessly exposed by the side B exposure head in accordance with the input data 24.

In the present embodiment, it is preferable that the maskless exposures in steps 25 and 35 be performed simultaneously. That is, as previously described, the side A exposure head and the side B exposure head of the maskless exposure means are mounted facing each other, and the test substrate is placed with the side A facing the side A exposure head and the side B facing the side B exposure head. Then, with the test substrate moving relative to the exposure heads, maskless exposure is performed simultaneously on both sides of the test substrate. This serves to greatly reduce the time compared with the case in which separate photo masks are formed on the respective sides of the test substrate and the respective sides are exposed separately. As a modification of the present embodiment, the maskless exposure may be performed on the respective sides of the substrate by introducing a time difference between them.

Next, in step 40, the masklessly exposed test substrate is developed.

Then, in step 50, both sides of the test substrate thus developed are optically inspected for an alignment error. The alignment error consists of a displacement $\Delta x$ in the X-axis direction, a displacement $\Delta y$ in the Y-axis direction, and a displacement $\Delta \theta$ in the rotational direction. The alignment error is stored as alignment data 60 in a database.

The optical inspection performed in step 50 will be described in further detail below.

When images of the shapes and positions of the patterns formed on the respective sides of the substrate are simultaneously captured by seeing through the substrate from one side thereof, and the captured data is processed, it is possible to detect how much disruption is caused in the mirror image relationship between the patterns formed on both sides of the substrate, that is, how much alignment error is caused between them.

In the present embodiment, images of the shapes and positions of the patterns formed on the respective sides of the substrate are not captured separately on the respective sides, but are captured simultaneously from one side of the substrate for the following reason. If images on the respective sides of the substrate are to be captured separately, an image capturing means will have to be provided on each side. Like the exposure heads, the image capturing means will have to be installed precisely facing each other and, if so installed, a positional displacement may occur over time between the image capturing means after the installation.

Generally, in a leadframe fabrication process using etching, a thin plate of a metallic material having excellent conductivity and good strength is used as the substrate to be exposed.

In the present embodiment, on the other hand, the test substrate used in the offline adjusting mode is implemented using a material that can allow light to pass through at least for a certain length of time, to facilitate detection for an alignment error.

The reason that the test substrate is constructed to allow light to pass through at least for a certain length of time is as follows. In the exposure process in steps 25 and 35 described above, a light source is installed on each side. In this case, if the light emitted from the light source on one side for exposing that same side is allowed to pass through the substrate and leaks into the other side, the exposure pattern cannot be properly formed by exposure. Therefore, if the substrate is constructed to block light during the exposure process, proper exposure can be accomplished, and if light is allowed to pass through the substrate during the optical inspection, the patterns on both sides of the substrate can be observed simultaneously from one side of the substrate.

In view of this, in the present embodiment, the test substrate should be implemented using a structure such that light projected from the exposure light source is blocked during the exposure process, and such that transmittance to the inspection light is high during the optical inspection process. Preferably, the test substrate has a structure that completely blocks the light projected from the exposure light source during the exposure process but completely transmits the inspection light during the optical inspection process.

More specifically, if the test substrate is implemented using, for example, a liquid crystal panel, the test substrate can be easily controlled by simply controlling the applied voltage so that the panel is put into a black state during the development process and into a transparent state during the optical inspection process. In this case, considering the protection and reuse of the liquid crystal panel, the test substrate may be implemented by covering both sides of the liquid crystal panel with transparent panels.

Alternatively, the test substrate may be implemented using transparent panels by sandwiching therebetween a removable black film that blocks the light of the exposure light source. In this case, the test substrate should be controlled so that the black film is held sandwiched between the transparent panels during the exposure process, while during the optical inspection process, the transparent panels are made transparent to the inspection light by removing the black film.

As described, the processing performed in the side A data processing system 30 and the processing performed in the side B data processing system 20 are substantially the same, except that the latter is additionally equipped with the function of mirror image conversion of the data.

In the present embodiment, the side B data has been created by converting the side A data into a mirror image of it so that the exposure pattern by the side A exposure head 3A and the exposure pattern by the side B exposure head 3B, when formed by maskless exposure, have a mirror image relationship to each other, but conversely, the side A data may be created by mirror image conversion from the side B data.

As described above, in the offline adjusting mode according to the present embodiment, when a mechanical displacement occurs between the positions of the side A exposure head 3A and the side B exposure head 3B due to the use of the pattern drawing apparatus over time, the resulting disruption caused in the patterns' mirror image relationship can be extracted as the alignment error data. If the maskless exposure in the online production mode is carried out based on the exposure data corrected using the alignment error data, the substrate can be easily fabricated while correctly retaining the patterns' mirror image relationship. Further, if the above-described offline adjusting mode is carried out as needed after the pattern drawing apparatus of the present embodiment has been put in operation, the alignment error data can be kept up to date.

Next, the online production mode will be described.

Figure 5:
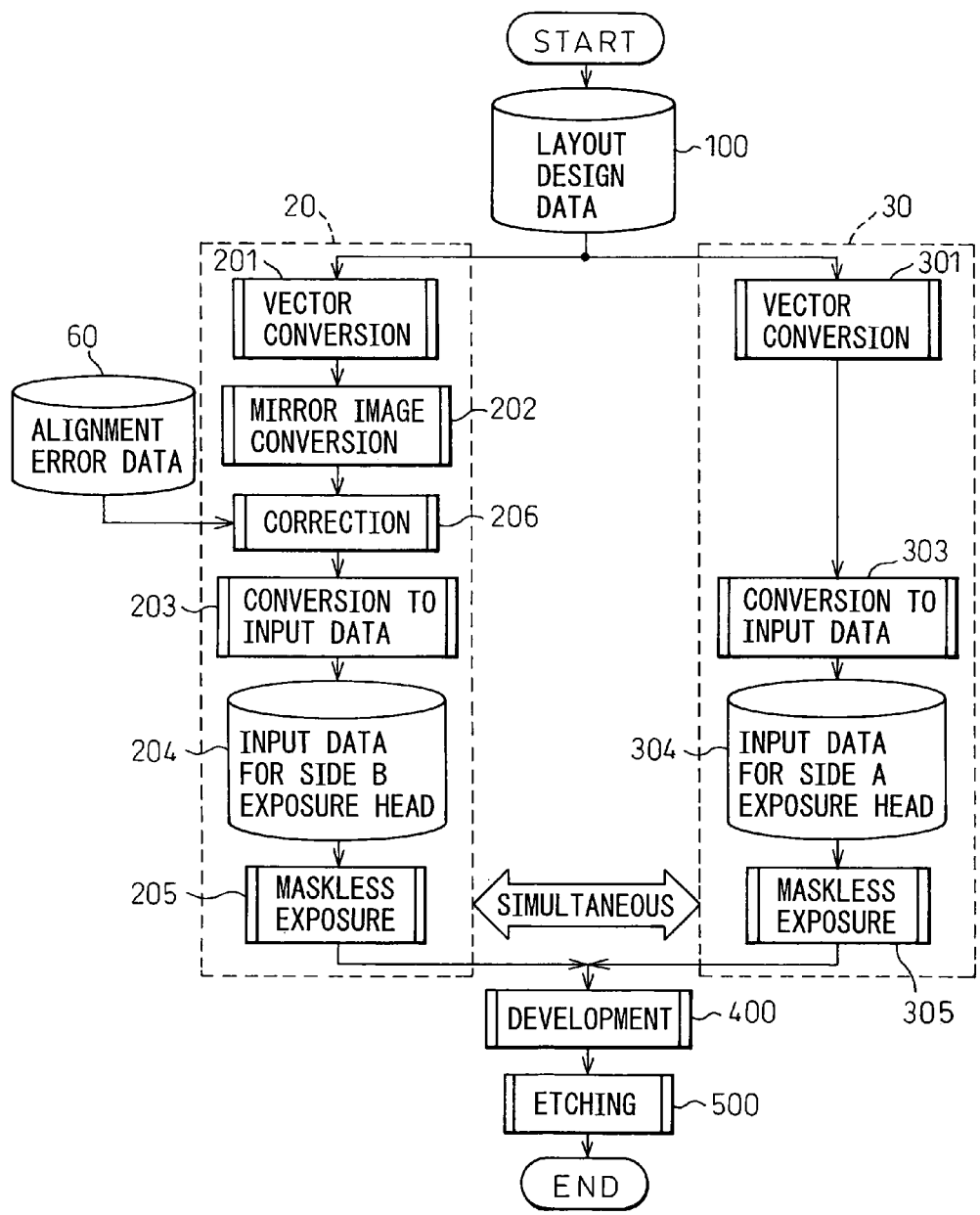
FIG. 5 is a flowchart illustrating operation in an online production mode according to the first embodiment of the present invention.

FIG. 5 is a flowchart illustrating the operation of the online production mode according to the first embodiment of the present invention.

In the online production mode, first the layout design data 100 is prepared in standard Gerber format, as shown in FIG. 5. The layout design data 100 is the exposure data that is input as design data to the maskless exposure means to form the desired exposure pattern on the substrate.

The layout design data 100 is input to the side A data processing system 30 which performs various processing to form the exposure pattern on the side A of the substrate, and also to the side B data processing system 20 which performs various processing to form the exposure pattern on the side B of the substrate.

In step 301 in the side A data processing system 30, the layout design data 100 of Gerber format is converted to the format of vector data for the side A.

Next, in step 303, the vector data created in step 301 is converted into input data 304 for input to the side A exposure head.

Then, in step 305, the side A of the substrate is masklessly exposed by the side A exposure head in accordance with the input data 304.

On the other hand, in step 201 in the side B data processing system 20, the layout design data 100 of Gerber format is converted to the format of vector data for the side B.

Next, in step 202, vector data for the side B is created by mirror image conversion so that the data has a mirror image relationship to the vector data for the side A. For example, when the coordinate axes are set as shown in FIG. 3, the vector data for the side A on the coordinate plane is reversed symmetrically about the Y axis to obtain the vector data for the side B, which is a mirror image of the vector data for the side A.

Next, in step 206, the vector data generated in step 202 is corrected using the alignment error data 60 obtained in the offline adjusting mode described with reference to FIGS. 3 and 4. In a specific method of correction, the respective components of the alignment error data 60 after the vector conversion, i.e., the displacement $\Delta x$ in the X-axis direction, the displacement $\Delta y$ in the Y-axis direction, and the displacement $\Delta \theta$ in the rotational direction, are subtracted from the vector data generated in step 202.

In step 203, the vector data corrected in step 206 is converted into input data 204 for input to the side B exposure head.

Then, in step 205, the side B of the substrate is masklessly exposed by the side B exposure head in accordance with the input data 204. Here, it is preferable that the maskless exposures in steps 205 and 305 be performed simultaneously. This serves to greatly reduce the time compared with the case in which separate photo masks are formed on the respective sides of the substrate and the respective sides are exposed separately; the effect is particularly great in mass production. As a modification of the present embodiment, the maskless exposure may be performed on the respective sides of the substrate by introducing a time difference between them.

Here, if there is a positional displacement between the side A exposure head and the side B exposure head that should have been arranged precisely facing each other, since the input data 304 and 204 to the side A exposure head and the side B exposure head are already corrected by using the alignment error data obtained in the offline adjusting mode, the exposure patterns on the respective sides of the substrate are formed by maskless exposure in a condition free from the alignment error, that is, in the proper condition maintaining the mirror image relationship between the respective sides of the substrate.

Next, in step 400, the masklessly exposed test substrate is developed.

In step 500, the developed substrate is etched.

As described above, according to the first embodiment of the present invention, in the fabrication of the substrate on which are formed the patterns that are mirror images of each other, since the patterns are formed on both sides of the substrate by the maskless exposure means that has the exposure heads arranged facing each other, the time required for the fabrication can be greatly reduced compared with the prior art in which separate photo masks are formed on the respective sides of the substrate and the respective sides are exposed separately.

Furthermore, as the exposure patterns are formed without using photo masks, the fabrication cost can be reduced and the resources saved.

The positions of the exposure heads are preadjusted so that one faces the other as precisely as possible in order to ensure that the patterns formed on both sides of the substrate by maskless exposure will have a mirror image relationship to each other; this eliminates the need for an optical treatment to be performed using the alignment marks as guide marks as in the prior art, and thus the fabrication process can be simplified.

Here, if there is a positional displacement between the exposure heads that should have been arranged precisely facing each other, as the input data to each exposure head can be corrected ahead of time by using the alignment error data obtained in the offline adjusting mode, the exposure patterns on the respective sides of the substrate can be formed by maskless exposure in a condition free from the alignment error, that is, in the proper condition maintaining the mirror image relationship between the respective sides of the substrate. In this way, the positions of the exposure heads, if displaced somewhat, can be easily adjusted, and the production cost can be reduced and the fabrication process shortened. For example, if the mounting positions of the exposure heads of the maskless exposure means are displaced over time, such displacements can be flexibly accommodated by correcting the data for pattern formation.

Next, a second embodiment of the present invention will be described.

In the second embodiment of the present invention, a pattern drawing apparatus for forming patterns that have a mirror image relationship to each other with respect to a substrate on both sides of the substrate comprises an inkjet patterning means as a means for drawing the patterns directly on both sides of the substrate in accordance with prescribed data.

Inkjet technology is a technology that ejects liquid droplets through nozzles in which microscopic holes are opened. Generally, inkjet technology is used for printers, but when applying the inkjet technology to inkjet patterning as in the present embodiment, the liquid droplets to be ejected from the nozzles should be formed from a liquid resin or the like that is applied as an etching resist. Inkjet technology can be classified into two main types: one is the piezoelectric type that utilizes a piezoelectric element which, when a voltage is applied, is caused to deform, causing a sudden increase in the liquid pressure in the ink chamber and thereby forcing a liquid droplet through the nozzle, and the other is the thermal type that forms a bubble in the liquid by a heater mounted on the head and thereby pushes out a liquid droplet. Either type can be used in the present embodiment.

The present embodiment is substantially the same as the first embodiment of the present invention described above, except that the maskless exposure means in the first embodiment is replaced by the inkjet patterning means.

Inkjet heads of the inkjet patterning means are mounted in the same manner as the exposure heads of the maskless exposure means described with reference to FIG. 1. That is, in the present embodiment, the pattern drawing apparatus for forming etching resist patterns on both sides of a substrate, the etching resist patterns being mirror images of each other with respect to the substrate, includes the inkjet patterning means which forms the etching resist patterns on both sides of the substrate by inkjetting on both sides of the substrate in accordance with prescribed data.

The inkjet patterning means includes a side A inkjet head and a side B inkjet head arranged with their head portions facing each other. The substrate on which the patterns are to be drawn is placed with the side A facing the side A inkjet head and the side B facing the side B inkjet head, and the patterns are drawn directly on both sides of the substrate by inkjetting.

In the inkjet patterning means, the side A inkjet head and the side B inkjet head are mounted by preadjusting their positions so that one faces the other as precisely as possible in order to ensure that the patterns formed on both sides of the substrate by inkjet patterning will have a mirror image relationship to each other.

In the present embodiment, similarly to the first embodiment, to enhance the patterning efficiency it is preferable to provide a plurality of pairs of opposing inkjet heads arranged in parallel as shown in FIG. 2 for inkjet patterning on the side A and side B of the substrate. In this case, the regions to be drawn on the drawing target, i.e., the substrate, are assigned to the respective inkjet head pairs, which perform the inkjet patterning in parallel fashion. To achieve the parallel processing, it is preferable to store the layout design data in the database by spatially dividing the data so that the data will be assigned selectively to the respective inkjet heads.

In the present embodiment also, a mechanical displacement can occur between the positions of the inkjet heads, causing an alignment error. Therefore, as in the first embodiment, it is preferable to further provide a correction process for eliminating such an alignment error so that the patterns formed on both sides are precisely superimposed on each other in a mirror image relationship.

Here, a description will be given of the operation of the pattern drawing apparatus in the offline adjusting mode and in the online production mode according to the second embodiment of the present invention. The basic principle of operation of the pattern drawing apparatus according to the present embodiment is substantially the same as that of the first embodiment already described; therefore, the following description deals only with the specific operation flows and differences from the first embodiment.

First, the offline adjusting mode will be described.

Figure 6:
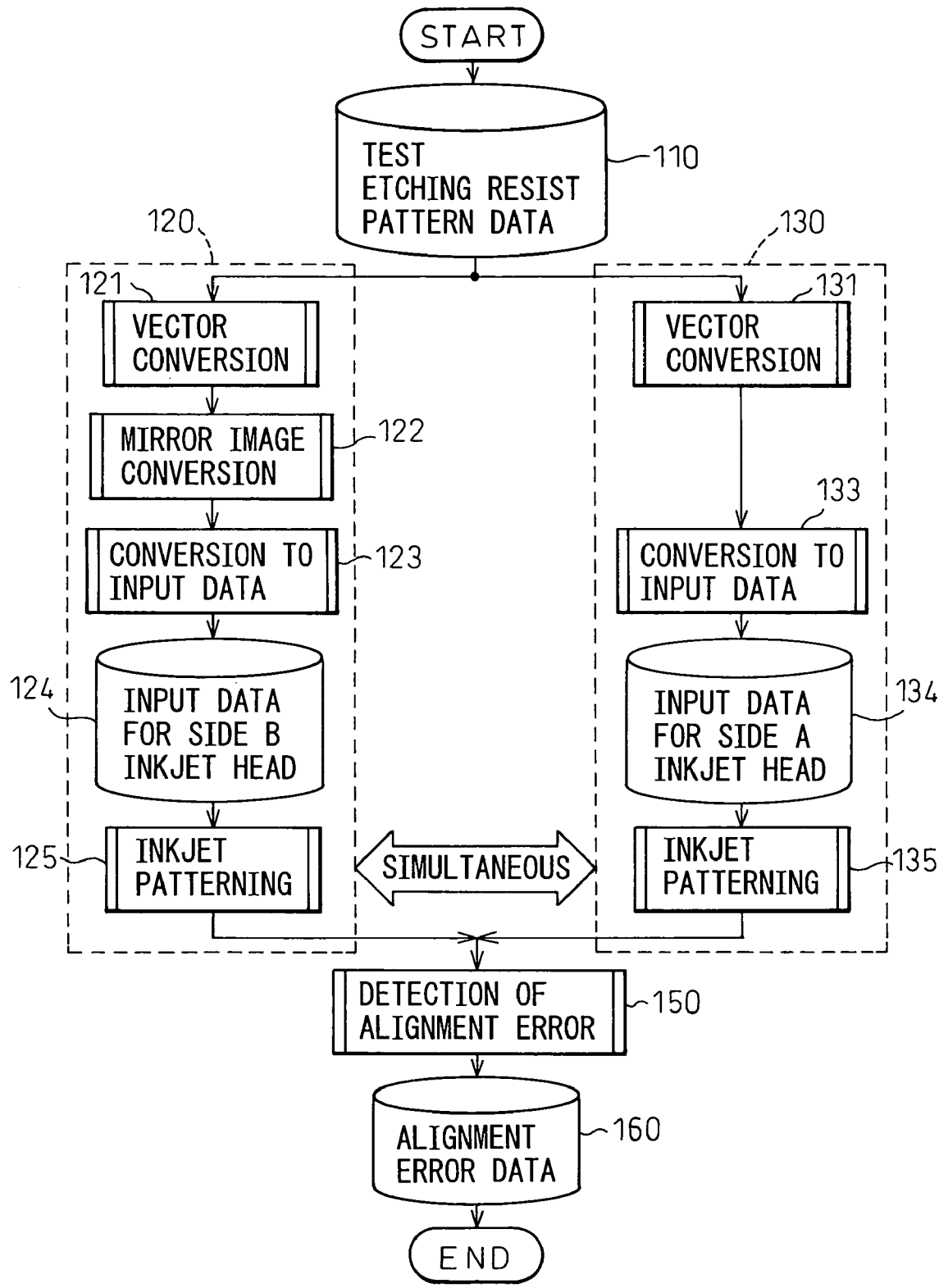
FIG. 6 is a flowchart illustrating operation in an offline adjusting mode according to a second embodiment of the present invention.

FIG. 6 is a flowchart illustrating the operation of the offline adjusting mode according to the second embodiment of the present invention.

In the offline adjusting mode, first, test etching resist pattern data 110 is prepared in standard Gerber format, as shown in FIG. 6.

The test etching resist pattern data 110 is input to the side A data processing system 130 which performs various processing to form the etching resist pattern on the side A of the substrate, and also to the side B data processing system 120 which performs various processing to form the etching resist pattern on the side B of the substrate.

In step 131 in the side A data processing system 130, the test etching resist pattern data 110 of Gerber format is converted to the format of vector data for the side A.

Next, in step 133, the vector data created in step 131 is converted into input data 134 for input to the side A inkjet head.

Then, in step 135, the side A of the test substrate is patterned using the side A inkjet head in accordance with the input data 134.

On the other hand, in step 121 in the side B data processing system 120, the test etching resist pattern data 110 of Gerber format is converted to the format of vector data for the side B.

Next, in step 122, vector data for the side B is created by mirror image conversion so that the data has a mirror image relationship to the vector data for the side A.

Next, in step 123, the vector data created in step 122 is converted into input data 124 for input to the side B inkjet head.

Then, in step 125, the side B of the test substrate is patterned using the side B inkjet head in accordance with the input data 124.

Here, it is preferable that the inkjet patterning in steps 125 and 135 be performed simultaneously. More specifically, the side A inkjet head and the side B inkjet head of the inkjet patterning means are mounted facing each other, and the test substrate is placed with the side A facing the side A inkjet head and the side B facing the side B inkjet head. Then, with the test substrate moving relative to the inkjet heads, inkjet patterning is performed simultaneously on both sides of the test substrate. As a modification of the present embodiment, the inkjet patterning may be performed on the respective sides of the substrate by introducing a time difference between them.

Next, in step 150, both sides of the test substrate after the inkjet patterning are optically inspected for an alignment error.

In the present embodiment, the test substrate is implemented using a material having high light transmittance, preferably a material transparent or semitransparent to the inspection light, to facilitate optical detection for an alignment error in the offline adjusting mode.

In the previously described first embodiment, control has been performed so that light does not pass through the test substrate during the maskless exposure process, because if light is allowed to pass through the test substrate, the exposure pattern cannot be properly formed on each side of the substrate. On the other hand, in the second embodiment of the present invention, the exposure, development, and etching processing is not needed, but the etching resist patterns can be drawn directly on the substrate in accordance with the design data by using inkjet technology; therefore, there is no need to control the light transmittance of the test substrate as in the first embodiment. Accordingly, in the second embodiment of the present invention, the test substrate need only have a structure that transmits light. For example, it can be implement using a transparent panel such as glass or a like substance.

Next, the online production mode will be described.

Figure 7:
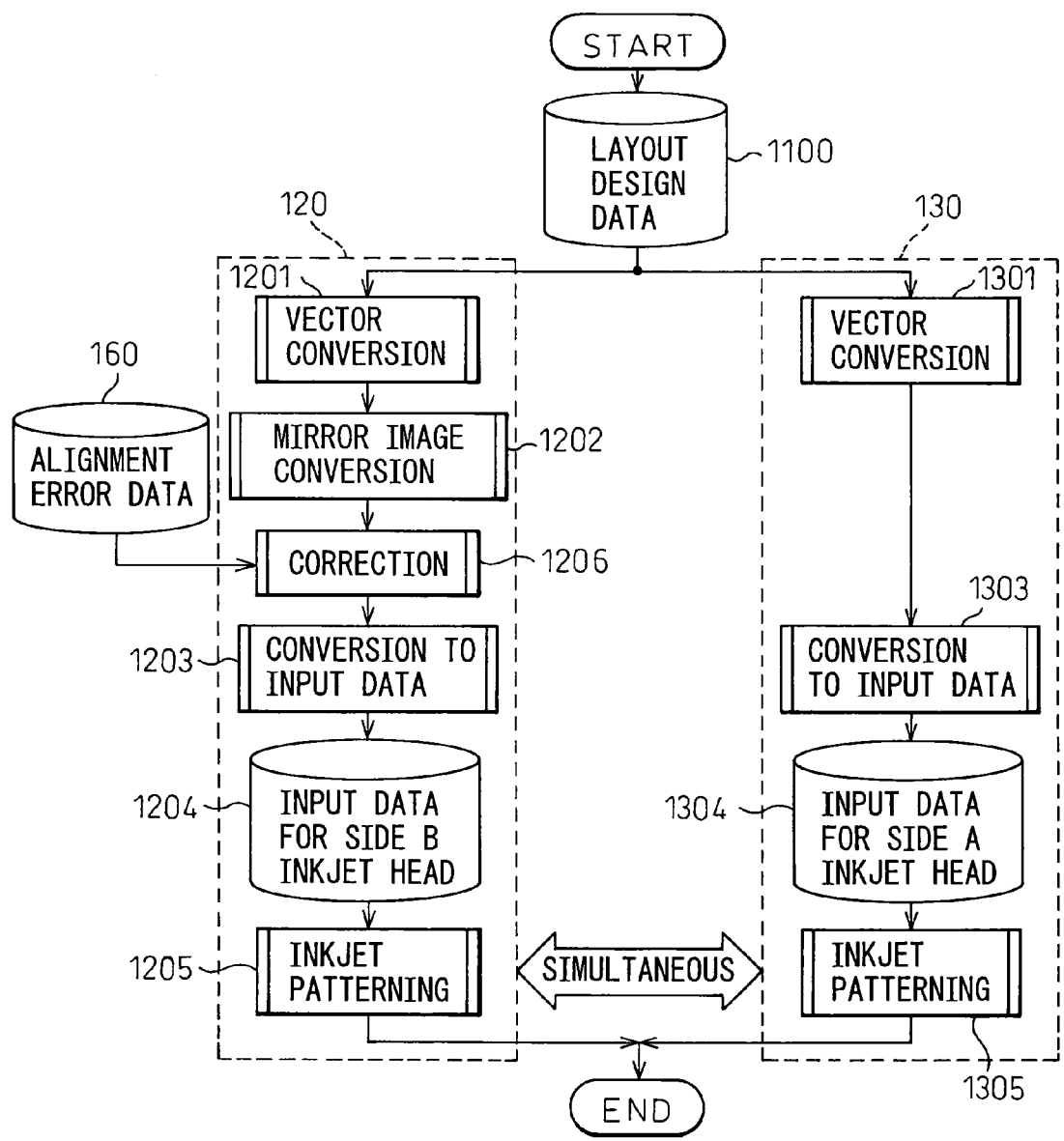
FIG. 7 is a flowchart illustrating operation in an online production mode according to the second embodiment of the present invention.
Figure 8:
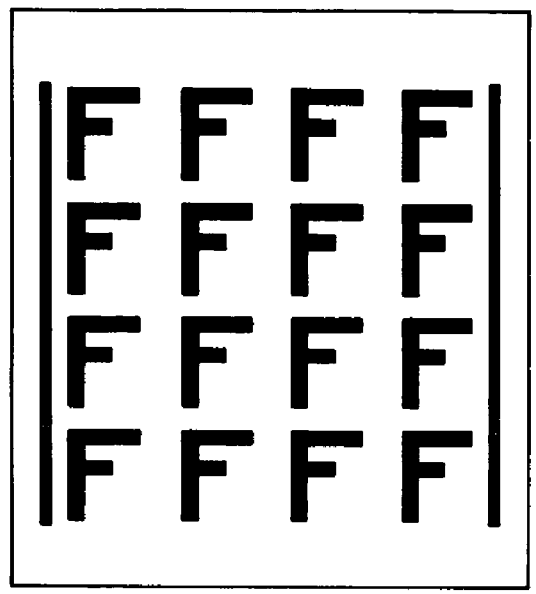
FIG. 8 is a diagram illustrating one side of a substrate on both sides of which are formed patterns that are mirror images of each other.
Figure 9:
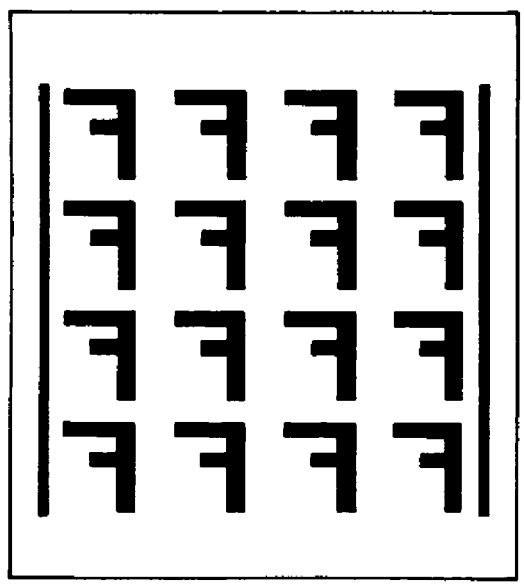
FIG. 9 is a diagram illustrating the other side of the substrate on both sides of which are formed the patterns that are mirror images of each other.

FIG. 7 is a flowchart illustrating the operation of the online production mode according to the second embodiment of the present invention.

In the online production mode, first the layout design data 1100 is prepared in standard Gerber format, as shown in FIG. 7.

The layout design data 1100 is input to the side A data processing system 130 which performs various processing to form the resist pattern on the side A of the substrate, and also to the side B data processing system 120 which performs various processing to form the resist pattern on the side B of the substrate.

In step 1301 in the side A data processing system 130, the layout design data 1100 of Gerber format is converted to the format of vector data for the side A.

Next, in step 1303, the vector data created in step 1301 is converted into input data 1304 for input to the side A inkjet head.

Then, in step 1305, the side A of the substrate is patterned using the side A inkjet head in accordance with the input data 1304.

On the other hand, in step 1201 in the side B data processing system 120, the layout design data 1100 of Gerber format is converted to the format of vector data for the side B.

Next, in step 1202, vector data for the side B is created by mirror image conversion so that the data has a mirror image relationship to the vector data for the side A. Next, in step

1206, the vector data generated in step 1202 is corrected using the alignment error data 160 obtained in the offline adjusting mode.

In step 1203, the vector data corrected in step 1206 is converted into input data 1204 for input to the side B inkjet head.

Then, in step 1205, the side B of the substrate is patterned using the side B inkjet head in accordance with the input data 1204.

Here, it is preferable that the inkjet patterning in steps 1205 and 1305 be performed simultaneously, as in the offline adjusting mode described above. As a modification of the present embodiment, the inkjet patterning may be performed on the respective sides of the substrate by introducing a time difference between them.

As described above, according to the second embodiment of the present invention, in the fabrication of the substrate on which are formed the patterns that are mirror images of each other, as the patterns are formed on both sides of the substrate by using the inkjet patterning means that has the inkjet heads arranged facing each other, the same effect as achieved by the foregoing first embodiment can be obtained.

In particular, in the second embodiment, as neither the photo masks nor the exposure, development, and etching processing is needed, the time and cost required for the fabrication can be further reduced.

The first and second embodiments have been described by taking as an example the formation of lead patterns of a leadframe member, but the present invention is not limited to this particular example; rather, the invention can be applied to any pattern formation in which the patterns that are mirror images of each other with respect to a substrate are formed on both sides of the substrate.

As described above, according to the present invention, in the fabrication of the substrate on which are formed the patterns that are mirror images of each other, as the patterns are formed on both sides of the substrate by using a technique, such as maskless exposure or inkjet patterning, that draws the patterns directly on the substrate, the time and cost required for the fabrication can be greatly reduced compared with the prior art in which separate photo masks are formed on the respective sides of the substrate and the respective sides are exposed separately. Furthermore, as there is no need for an optical treatment to be performed using the alignment marks as guide marks as in the prior art, the fabrication process can be simplified.

Further, according to the present invention, the positional displacements of the patterns formed on both sides of the substrate, which can occur due to displacements of the maskless exposure heads or the inkjet heads, are measured, and the data to be used for pattern formation is corrected accordingly; therefore, the substrate can be easily fabricated while correctly maintaining the patterns' mirror image relationship. If the maskless exposure heads or the inkjet heads are somewhat displaced in position, or if they are displaced over time, alignment errors can be eliminated by precorrecting the data to be used for pattern formation. This not only serves to shorten the fabrication process, but also can reduce the burden of equipment adjustment and maintenance.

Moreover, as there is no need to consider the number of times that the photo masks can be used as in the prior art, the fabrication cost can be reduced and the resources saved.

In particular, in the second embodiment of the present invention, the time and cost required for the fabrication can be greatly reduced because the patterns can be formed using the inkjet patterning means without using a photolithographic process.

What claimed is:

1. A pattern drawing apparatus for forming exposure patterns, that have a mirror image relationship to each other with respect to a substrate, on both sides of the substrate, comprising:

maskless exposure means for forming the exposure patterns on both sides of the substrate by masklessly exposing both sides of the substrate in accordance with prescribed data;

detecting means for detecting a displacement from the mirror image relationship of the exposure patterns by using a test substrate on both sides of which the exposure patterns are formed by the maskless exposure means; and correcting means for correcting exposure data based on the displacement detected by the detecting means so that the mirror image relationship will be maintained between the exposure patterns when the exposure patterns are formed on both sides of the test substrate by maskless exposure by the maskless exposure means in accordance with the exposure data, wherein:

the detecting means includes developing means for developing both sides of the test substrate after the maskless exposure, and the detecting means detects the displacement from the mirror image relationship by reading the exposure patterns that are formed on both sides of the test substrate by the developing means.

2. A pattern drawing apparatus as claimed in claim 1, wherein:

the maskless exposure means includes exposure heads arranged facing each other; and the substrate is placed with each side thereof facing a corresponding one of the exposure heads so that both sides of the substrate are masklessly exposed.

3. A pattern drawing apparatus as claimed in claim 1, wherein the detecting means includes:

image capturing means for capturing images on the test substrate from one side thereof; and control means for controlling the test substrate in such a manner as to block light during the exposure by the exposure means and to transmit light during the image capturing by the image capturing means.

4. A pattern drawing apparatus as claimed in claim 3, wherein the test substrate comprises a liquid crystal panel having a structure such that light projected from an exposure light source is prevented from being transmitted through the liquid crystal panel during the exposure by the exposure means, and such that transmittance to inspection light is high during the image capturing by the image capturing means.

5. A pattern drawing apparatus as claimed in claim 1, wherein:

the detecting means includes an image capturing means for capturing images on the test substrate from one side thereof, and the test substrate blocks light during the exposure by the exposure means and transmits light during the image capturing by the image capturing means.

6. A pattern drawing apparatus as claimed in claim 5, wherein the test substrate comprises a liquid crystal panel having a structure such that light projected from an exposure light source is prevented from being transmitted through the liquid crystal panel during the exposure by the exposure means, and such that transmittance to inspection light is high during the image capturing by the image capturing means.

7. A pattern drawing apparatus as claimed in claim 1, wherein the exposure patterns are lead patterns of a lead-frame member.

8. A pattern drawing method for forming exposure patterns that have a mirror image relationship to each other with respect to a substrate on both sides of the substrate, comprising:
- a test exposure step for forming test exposure patterns on both sides of a test substrate by masklessly exposing both sides of the test substrate by using a maskless exposure means;
- a detection step for detecting a displacement from the mirror image relationship of the test exposure patterns by using the test substrate on both sides of which the test exposure patterns are formed by the maskless exposure means;
- a correction step for correcting exposure data based on the displacement detected in the detecting step so that the mirror image relationship will be maintained between the exposure patterns when the exposure patterns are formed on both sides of the test substrate by maskless exposure by the maskless exposure means in accordance with the exposure data; and
- a production exposure step for forming the exposure patterns on both sides of the substrate by performing maskless exposure using the maskless exposure means, based on the corrected exposure data obtained in the correction step, wherein:
    - the detection step includes a developing step for developing both sides of the test substrate after the test exposure step, and
    - the displacement from the mirror image relationship is detected by reading the exposure patterns that are formed on both sides of the test substrate in the developing step.

9. A pattern drawing method as claimed in claim 8, wherein the maskless exposure means includes exposure heads arranged facing each other, and wherein
the substrate is placed with each side thereof facing a corresponding one of the exposure heads so that both sides of the substrate are masklessly exposed.

10. A pattern drawing method as claimed in claim 8, wherein the detection step includes:
- an image capturing step for capturing images on the test substrate from one side thereof; and
- a control step for controlling the test substrate in such a manner as to block light during the exposure in the test exposure step and to transmit light during the image capturing in the image capturing step.

11. A pattern drawing method as claimed in claim 10, wherein the test substrate comprises a liquid crystal panel having a structure such that light projected from an exposure light source is prevented from being transmitted through the liquid crystal panel during the exposure in the test exposure step, and such that transmittance to inspection light is high during the image capturing in the image capturing step.

12. A pattern drawing method as claimed in claim 8, wherein the detecting step includes an image capturing step for capturing images on the test substrate from one side thereof, and wherein
the test substrate blocks light during the exposure in the test exposure step and transmits light during the image capturing in the image capturing step.

13. A pattern drawing method as claimed in claim 12, wherein the test substrate comprises a liquid crystal panel having a structure such that light projected from an exposure light source is prevented from being transmitted through the liquid crystal panel during the exposure in the test exposure step, and such that transmittance to inspection light is high during the image capturing in the image capturing step.

14. A pattern drawing method as claimed in claim 8, wherein the exposure patterns are lead patterns of a lead-frame member.

15. A test apparatus for use in a pattern drawing apparatus for forming
exposure patterns that have a mirror image relationship to each other with respect to a
substrate on both sides of the substrate; comprising
- maskless exposure means, having exposure heads arranged facing each other, for masklessly exposing both sides of the substrate by sandwiching the substrate to be exposed between the exposure heads;
- a test substrate that blocks or transmits light, and on both sides of which test exposure patterns are formed by maskless exposure using the maskless exposure means;
- developing means for developing both sides of the test substrate on which the test exposure patterns have been formed by exposure;
- image capturing means for capturing images on the test substrate from one side thereof after the exposure patterns have been formed thereon by the developing means;
- control means for controlling the test substrate in such a manner as to block light during the exposure by the exposure means and to transmit light during the image capturing by the image capturing means; and
- detecting means for detecting a displacement from the mirror image relationship of the test exposure patterns on the test substrate, based on the images captured by the image capturing means.

16. A test apparatus as claimed in claim 15, wherein the test substrate has a structure such that light projected thereon is prevented from being transmitted therethrough during the exposure by the exposure means, and such that transmittance to inspection light is high during the image capturing by the image capturing means.

17. A test apparatus as claimed in claim 15, wherein the test substrate comprises a liquid crystal panel having a structure such that light projected thereon is prevented from being transmitted therethrough during the exposure by the exposure means, and such that transmittance to inspection light is high during the image capturing by the image capturing means.

18. A test apparatus as claimed in claim 15, further comprising correcting means for correcting exposure data based on the displacement detected by the detecting means so that the mirror image relationship will be maintained between the exposure patterns when the exposure patterns are formed on both sides of the substrate by maskless exposure by the maskless exposure means in accordance with the exposure data.

* * * * *